(12) United States Patent
Kern

(10) Patent No.: US 6,222,111 B1
(45) Date of Patent: Apr. 24, 2001

(54) SPECTRALLY SELECTIVE THERMOPILE DETECTOR

(75) Inventor: Mark T. Kern, Goleta, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 08/486,022

(22) Filed: Jun. 7, 1995

(51) Int. Cl.[7] ................................................... H01L 37/00
(52) U.S. Cl. .................... 136/201; 136/213; 250/338.4; 250/339.01; 250/339.02; 250/339.05; 374/123; 374/127; 374/179
(58) Field of Search .................................. 136/200, 201, 136/205, 206, 211, 212, 213, 214, 215, 224, 225, 227, 230, 231, 242; 250/338.4, 339.01, 339.02, 339.03, 339.04, 339.05; 374/123, 127, 129, 130, 131, 179, 181, 182

(56) References Cited

U.S. PATENT DOCUMENTS

| | | | |
|---|---|---|---|
| 3,147,436 | * 9/1964 | Hopfer | 324/95 |
| 3,293,082 | 12/1966 | Brouwer et al. | 136/206 |
| 3,354,309 | * 11/1967 | Volkovisky | 250/83 |
| 3,405,271 | 10/1968 | Stevens et al. | 250/83.3 |
| 3,405,272 | 10/1968 | Stevens et al. | 250/83.3 |
| 3,405,273 | 10/1968 | Stevens et al. | 250/83.3 |
| 3,424,624 | * 1/1969 | Villers et al. | 136/213 |

(List continued on next page.)

OTHER PUBLICATIONS

Applied Optics, Apr. 1964, vol. 3, No. 4, "Solid–Backed Evaporated Thermopile Radiation Detectors", Robert W. Astheimer and Seymour Weiner, pp. 493–500.

"A Batch–Fabricated Silicon Thermopile Infrared Detector", G.R. Lahiji and Kensall D. Wise, IEEE Transactions On Electron Devices, vol. Ed–29, No. 1, Jan. 1982, pp. 14–22.

"A Linear Thermopile Infrared Detector Array With On–Chip Multiplexing", I.H. Choi and K.D. Wise, IEEE publication, 1985, p. 132–135. No month available.

"A Silicon–Thermopile–Based Infrared Sensing Array For Use In Automated Manufacturing", I.H. Choi and K.D. Wise, IEEE Transactions On Electron Devices, vol. Ed–33, No. 1, Jan. 1986, pp. 72–79.

"The Role Of Thin Films In Integrated Solid–State Sensors", K.D. Wise, J. Vac. Sci Technol. A. vol. 4, No. 3, p. 617–622, May/Jun. 1986.

*Primary Examiner*—Kathryn Gorgos
*Assistant Examiner*—Thomas H. Parsons
(74) *Attorney, Agent, or Firm*—William C. Schubert; Glenn H. Lenzen, Jr.

(57) ABSTRACT

A thermopile radiation detector (10) has an optical filter layer (16) that supports a thermopile detector (22) and, in addition, filters undesired wavelengths. The filtering is accomplished by selectively absorbing electromagnetic radiation at predetermined wavelengths. The use of the thermopile radiation detector simplifies the overall construction of a system that incorporates the detector by eliminating one focal point in the optical system. By altering the filter material, the number of layers of filter material, etc., a plurality of detectors can be constructed, each responsive to a different wavelength. In forming the detector, the filter can be deposited on a thin backing material such as aluminum. Examples of suitable filter materials include alternating layers of zinc selenide/magnesium fluoride or germanium/magnesium fluoride. After the filter is deposited, the backing is etched away and suitable thermocouples, such as bismuth/antimony, are deposited on one side of the filter. Incident radiation is directed to the reverse side of the filter for selective absorption and detection.

18 Claims, 2 Drawing Sheets

U.S. PATENT DOCUMENTS

| | | | |
|---|---|---|---|
| 3,611,805 | * 10/1971 | Hishikari | 73/355 R |
| 3,687,713 | 8/1972 | Adams | 117/71 R |
| 3,715,288 | 2/1973 | Risgin | 204/38 A |
| 3,781,549 | 12/1973 | Fletcher et al. | 250/211 J |
| 3,965,568 | 6/1976 | Gooch | 29/583 |
| 4,098,617 | 7/1978 | Lidorenko et al. | 148/1.5 |
| 4,148,052 | 4/1979 | Nathanson et al. | 357/30 |
| 4,229,066 | * 10/1980 | Rancourt et al. | 350/1.6 |
| 4,282,290 | 8/1981 | Pellicori et al. | 428/472 |
| 4,293,768 | 10/1981 | Adachi et al. | 250/338 |
| 4,436,363 | * 3/1984 | Steinbruegge et al. | 350/1.6 |
| 4,456,919 | * 6/1984 | Tomita et al. | 357/28 A |
| 4,459,484 | * 7/1984 | Tar | 250/338 |
| 4,558,342 | * 12/1985 | Sclar | 357/30 |
| 4,956,555 | * 9/1990 | Woodberry | 250/339 |
| 5,038,041 | * 8/1991 | Egan | 250/349 |
| 5,041,723 | * 8/1991 | Ishida et al. | 250/339 |
| 5,056,929 | * 10/1991 | Watanabe et al. | 374/181 |
| 5,072,109 | * 12/1991 | Aguilera, Jr. et al. | 250/226 |
| 5,099,121 | * 3/1992 | Allen | 250/339 |
| 5,100,479 | * 3/1992 | Wise et al. | 136/225 |
| 5,138,164 | * 8/1992 | Koh | 250/339 |
| 5,157,258 | * 10/1992 | Gunning, III et al. | 250/339 |
| 5,159,199 | * 10/1992 | LaBaw | 250/339 |
| 5,300,778 | * 4/1994 | Norkus et al. | 250/339.01 |
| 5,393,351 | * 2/1995 | Kinard et al. | 136/225 |

* cited by examiner

SPECTRALLY SELECTIVE THERMOPILE DETECTOR

BACKGROUND OF THE INVENTION

1. Field of the Invention

This invention relates generally to detectors of electromagnetic radiation and, in particular, to thermopile radiation detectors.

2. Description of the Re

Conventional thermopiles are generally of the two types shown in FIGS. 1 and 2. FIG. 1 illustrates a solid backed thermopile 1 having a substrate 2 that contains a layer 3 comprised of a thermal and electrical insulating material. Overlying the layer 3 is a bi-metallic thermocouple junction 6 comprised of a first metal layer 4 (e.g., Bi) and a second metal layer 5 (e.g., Sb). Disposed over the top of the thermocouple junction 6 is a layer 8 of blackening material that renders the thermocouple metals layers 4 and 5 more absorptive at all wavelengths. In this device incident radiation is directed as indicated by the arrow designated $\lambda$.

Reference in this regard can be had to a publication by R. W. Astheimer et al., "Solid-Backed Evaporated Thermopile Radiation Detectors", Applied Optics, vol. 3, no. 4, 4/64. As related therein a solid-backed thermocouple radiation detector consists essentially of a pair of metallic junctions deposited onto a heat sink, one junction being in good thermal contact with the sink by conduction while the other is thermally isolated by a thin insulating layer. The area of the active junction is considered to be a blackened portion over the insulator, while the "cold" or reference junction is formed by the opposite ends of the metal strips which are in good conductive thermal contact with the sink.

FIG. 2 illustrates a conventional film-backed thermopile 1' and having an aperture or cavity 9 made within the substrate 2 beneath the thermocouple junction 6. The film-backed thermopile 1' is similar to the solid backed thermopile of FIG. 1, except that an electrically insulating film layer 7 (such as $Al_2O_3$ or mylar) replaces the insulating layer 3 of FIG. 1. A layer 8 of blackening material is provided to enhance the radiation absorbing qualities of the metal layers 4 and 5. L1 and L2 generally indicate electrical leads which are provided to read-out the voltage that is generated by the thermocouple junction 6. The approach of FIG. 2 generally increases the electrical response of the thermopile (in volts output per watt of radiation received) over the device of FIG. 1. However, the increase in electrical response is made at the expense of reducing the frequency response.

Reference can also be made to commonly assigned U.S. Pat. No. 3,405,272 (Oct. 8, 1968), entitled "Film Supported Detector with Low Heat Transfer Impedance Path from Cold Junctions to Thermal Sink" by N. B. Stevens et al., and also to commonly assigned U.S. Pat. No. 3,405,271 (Oct. 8, 1968), entitled "Detector Having Radiation Collector Supported on Electrically Insulating Thermally Conducting Film" by N. B. Stevens et al. In both of these commonly assigned U.S. Patents an aluminum oxide film is disposed over surfaces of a cold sink and spans a cavity within the cold sink. The aluminum oxide film supports two thermoelectric materials (Bi and Sb).

Referring again to FIG. 1 and FIG. 2, the blackening material 8, such as gold black or bismuth black, is evaporated onto the sensitive area of the thermopile. This blackening material renders the surface generally at least 80 percent absorptive at all wavelengths, thus increasing the responsivity (in volts/watt) of the device.

It is noted that in FIGS. 1 and 2 only one thermocouple junction is shown. However, in most practical devices there are a number of such junctions (e.g., 15 to 25) in a series connection in order to increase the voltage output for a given radiation input power. For example, if one junction yields 100 $\mu V/°$ C., 20 junctions would ideally yield 2000 $\mu V/°$ C.

One significant disadvantage of these conventional approaches is that the thermopile is not spectrally selective, i.e., is not tuned to a specific, relatively narrow range of wavelengths. This is due to the fact that the conventional blackening materials used to form the layer 8 absorb over a wide spectral region, typically from the ultraviolet to the far infrared.

To overcome this problem, and to thus make a thermopile detector that is spectrally selective, it is necessary to position a discrete optical filter between the thermopile detector and the source of radiation to be detected. The optical filter's spectral characteristics are selected so as to pass only the range of wavelengths that are desired to be detected.

As can be appreciated, the use of an external optical filter adds cost, complexity, and mass to the overall radiation detection system.

Furthermore, an external filter is preferably placed at a focal point of the optical system in order to reduce the size of the filter. This requirement further complicates the design of the overall optical system, and may require that an additional focal point be provided for the filter.

Additionally, the requirement to provide an external filter limits a number of different thermopile detectors that can be placed within a small area, wherein each of the thermopile detectors would be responsive to a different range of wavelengths. That is, for small size detector packages (e.g., TO-5 size) or for arrays of detectors on a focal plane, providing a multiplicity of detectors responsive to different wavelengths is difficult or impossible using a conventional broadband detector with discrete optical filters.

OBJECTS OF THE INVENTION

A first object of this invention is to provide an improved thermopile radiation detector that overcomes the problems inherent in prior art thermopile radiation detectors.

Another object of this invention is to provide an improved thermopile radiation detector that includes a filter layer that selectively absorbs incident electromagnetic radiation within a desired range of wavelengths, while selectively reflecting wavelengths outside of the desired range.

A further object of this invention is to provide an improved thermopile radiation detector that eliminates a requirement to provide a discrete optical passband filter between a source of electromagnetic radiation and the detector.

SUMMARY OF THE INVENTION

The foregoing and other problems are overcome and the objects of the invention are realized by a thermopile radiation detector having an optical filter coating that supports the thermopile detector and, in addition, filters undesired wavelengths. The filtering is accomplished by selectively absorbing electromagnetic radiation at predetermined wavelengths (i.e., by selectively reflecting all wavelengths except wavelengths within the desired band). The thermopile radiation detector of this invention simplifies the overall construction of a system that incorporates the detector by eliminating one focal point in the optical system. By altering the filter material, the number of layers of filter material, and/or the thickness of the individual layers a plurality of detectors can be constructed, each responsive to a different wavelength.

In forming the detector, the filter can be deposited on a layer of backing material such as aluminum foil. Examples of suitable filter materials include alternating layers of zinc selenide/magnesium fluoride or germanium/magnesium fluoride. After the filter is deposited, the backing is removed and suitable thermocouples, such as bismuth/antimony, are deposited on one side of the filter. Incident radiation may be then directed to the reverse side of the filter for selective absorption and detection.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 3:
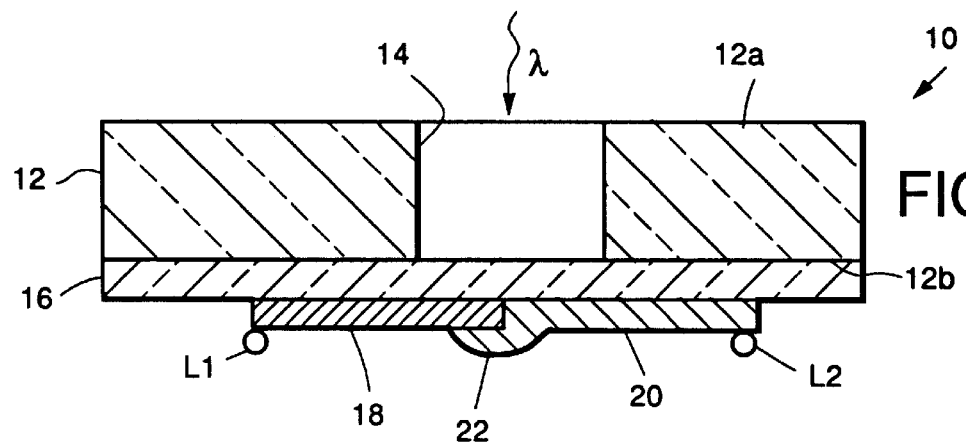
FIG. 3 is an enlarged cross-sectional view, not to scale, that illustrates a thermopile detector that is constructed in accordance with this invention to include an integral spectrally selective radiation absorbing filter.

FIG. 3 is a cross-sectional view of a presently preferred embodiment of a thermopile radiation detector 10 in accordance with the teaching of this invention. The use of the thermopile radiation detector 10 overcomes the problems described previously.

The thermopile radiation detector 10 includes a substrate 12 having a cavity 14. In this case the cavity 14 provides a path for incident, typically broadband, radiation to enter the detector 10 through a first (radiation receiving) surface 12a of the substrate 12. Overlying an opposite surface 12b, and also spanning the cavity 14, is an optical filter layer 16. The optical filter layer 16 performs two functions. A first function is to selectively absorb a relatively narrow band of wavelengths from the incident radiation. A second function is to physically support a thermocouple junction 22 that is formed between dissimilar materials 18 and 20, such as layers of Bi and Sb.

Although a single thermocouple junction is shown in FIG. 3, it should be noted that a typical thermopile radiation detector would typically be comprised of a plurality of such junctions all connected together in series so as to increase the output voltage potential for a given radiation input power.

Figure 1:
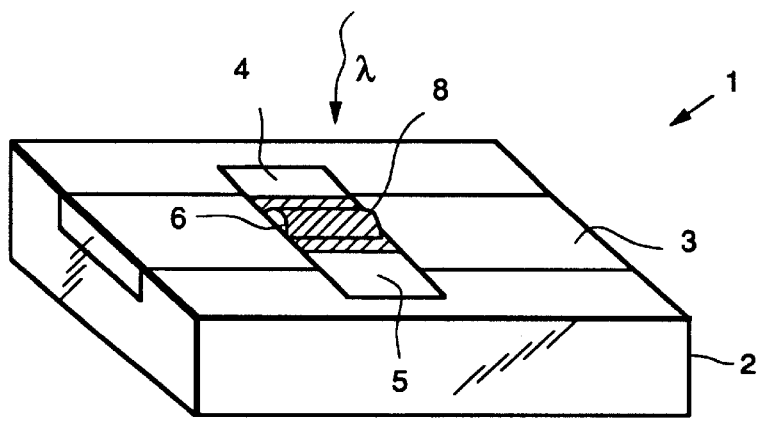
FIG. 1 is an elevational view of a conventional solid-backed thermopile.
Figure 2:
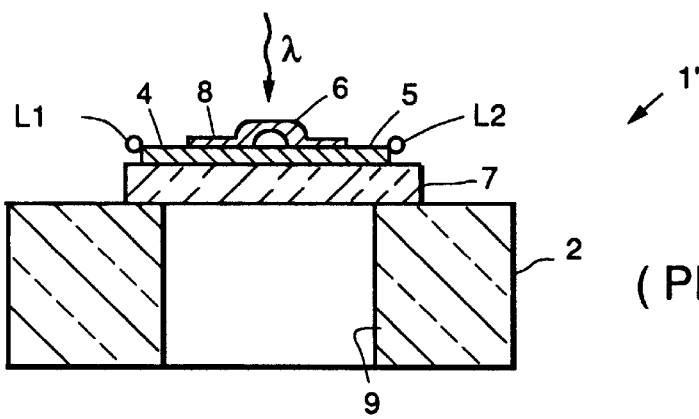
FIG. 2 is a cross-sectional view of a conventional film-backed thermopile.

The optical filter layer 16 is designed to absorb incident radiation within the desired range of wavelengths and to reflect at all other wavelengths. The thickness of the optical filter layer 16 is preferably selected to provide approximately the same thermal "mass" as the film backed thermopile 1' of FIG. 2. Thermal "mass" can be defined as the product of the film material's density, thickness, and specific heat, and represents a measure of how easily the temperature of the film can be changed by incoming radiation.

In preferred embodiments of this invention, the filter 16 comprises a multi-layer dark coating. Examples of multi-layer dark coatings which may be used for the filter 16 are discussed in U.S. Pat. No. 4,282,290, issued Aug. 4, 1981, entitled "High Absorption Coating", and by Macleod, H. A., *Thin-Film Optical Filters*, (2 Ed.), MacMillan Publishing Co., New York, N.Y. (1986). In general, multi-layer dark coatings are designed for a relevant spectral range by varying the materials used for the various layers, the thickness of the layers, and the number of layers.

It may be appreciated that the dual functions of the optical filter layer 16 place conflicting requirements on the optical filter layer. First of all, the optical filter layer 16 should preferably be thin (less than one micron and often in the range of 2000–5000 Angstroms) in order to have a sufficiently low thermal mass to provide an adequate responsivity to rapid changes in the incident radiation. However, for a film layer having a thickness in this range it becomes difficult to provide sufficient structural support for the overlying bimetallic junction 22 and metal layers 18 and 20.

Figure 4:
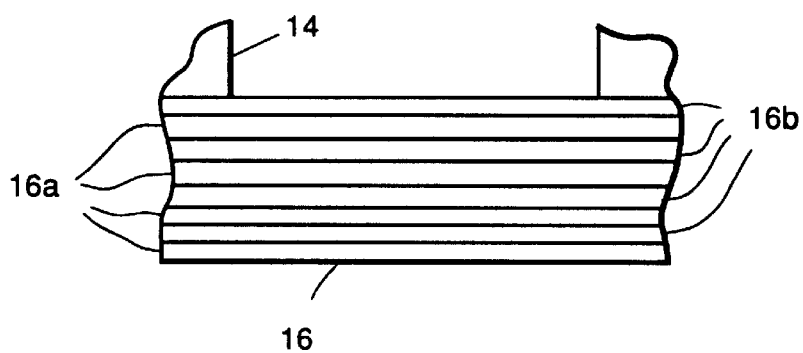
FIG. 4 is a cross-sectional view, not to scale, of the spectrally selective radiation absorbing filter of FIG. 3, and illustrates in greater detail the multi-layered construction of the filter.

Referring now also to FIG. 4, one presently preferred embodiment of the optical filter layer 16 is a multi-layered stack comprised of alternating thin films 16a and 16b. By example, the films 16a and 16b may be comprised of ZnSe and $MgF_2$, respectively. Also by example, the films 16a and 16b may be comprised of Ge and $MgF_2$, respectively. Both of these material systems have been found to provide adequate spectrally selective filtering capabilities, and can exhibit a thermal mass that is approximately equivalent to a one mil thick mylar film, if limited to the appropriate total thickness.

It should be noted that since it is the thermal mass comprised of both the thermocouple junction 22 and the optical filter layer 16 that must be heated by the incoming radiation, the junction 22 can instead be irradiated from the junction side, so long as the underlying filter surface is not significantly occluded by the thermopile junctions. That is, in that Bi and Sb can exhibit a significant reflectivity to the incident radiation, a sufficient amount of surface area of the optical filter layer 16 must be exposed to the incident radiation to adequately detect same. The amount of exposed area depends at least in part on the thermal mass of the selected filter material.

As such, although illumination from the filter side of the thermopile detector is preferred, as shown in FIG. 3, it is not required.

In accordance with a method of constructing the thermopile detector 10, processing begins with a thin sheet of backing material such as aluminum. A one inch square piece of aluminum foil forms a suitable substrate. On one side of the aluminum sheet is deposited, such as by evaporation, alternating layers of the desired filter materials (e.g., alternating layers of zinc selenide/magnesium fluoride or germanium/magnesium fluoride). The aluminum on the side opposite the deposited filter material is then etched away by suitable chemical means. By example, a ⅜" diameter area of aluminum is etched away in the center of the foil square. Next, a selected substrate 12 is provided, the substrate having, in this example, a toroidal shape with an outside diameter that matches the diameter of the etched-away aluminum region. The substrate surrounds the cavity 14, which may have a diameter of ⅛". Suitable thicknesses for the substrate 12, and hence the depth of the cavity 14, may be in the range of 0.02 to 0.1". The foil bearing the circular, filter-only area is then bonded to the surface 12b of the substrate 12 such that the filter spans the cavity 14. The surrounding excess foil is then trimmed away, and processing continues to deposit multiple ones of the thermocouple junctions 18, 20, 22 onto the opposite side of the filter 16 over the cavity 14.

The thermal expansion characteristics of the substrate 12 are preferably selected so as to closely match the thermal expansion characteristics of the materials that comprise the filter 16. The substrate 12 is also selected to have good thermal conductivity to facilitate the operation of the thermocouple cold junctions. The substrate 12 may be electrically conductive or non-conductive, whereas the filter layer 16 should be sufficiently electrically non-conducting so as not to short out the thermocouple junctions. The use of $Al_2O_3$ is preferred as a substrate material for many applications, so long as the thermal expansion characteristic of the selected filter material is a reasonably close match to that of $Al_2O_3$.

There are a number of advantages of a spectrally selective detector of this type. First, the use of this detector relaxes requirements on discrete optical filters that would need to be placed in an optical system. Often times, it is very difficult to build a filter that transmits one wavelength and blocks all others. Using this technique, the detector itself is designed to absorb the wavelength of interest. Rejection of out-of-band wavelengths is accomplished by the detector and windows of the optical system working in tandem, with the windows designed as the primary out-of-band blocking elements.

A second advantage is that it allows for a simpler optical system. Filters in an imaging system are usually placed at a focal point so that an extremely large filter is not needed. If the detector itself is spectrally selective, one focal point of the system can be eliminated.

Figure 5:
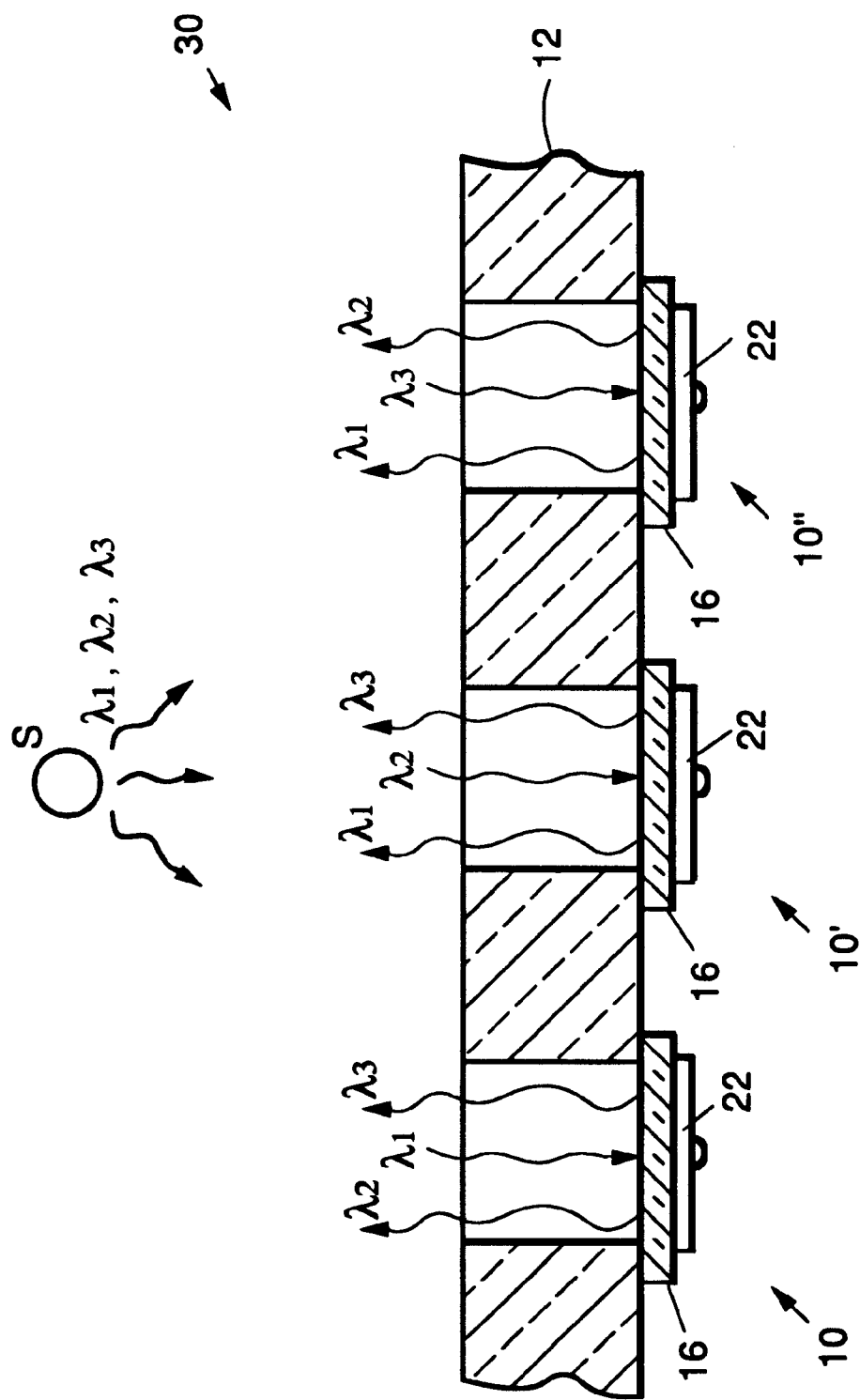
FIG. 5 is a cross-sectional view, not to scale, of a portion of an array of thermopile detectors, wherein different ones of the detectors are responsive to different bands of wavelengths.

Referring now to FIG. 5, a third advantage of this technique allows the possibility of constructing dual (or multi) detector housings with each detector sensitive to a different wavelength emanating from a source (S). For example, a first detector 10 of an array 30 may be responsive to wavelengths within a band centered on a first wavelength $\lambda_1$ (e.g., 4 microns), a second detector 10' may be responsive to wavelengths within a band centered on a second wavelength $\lambda_2$ (e.g., 7 microns), while a third detector 10" may be responsive to wavelengths within a band centered on a third wavelength $\lambda_3$ (e.g., 10 microns).

Additional advantages are obtained in those imaging systems requiring narrow spectral passbands. Since the spectral selectivity is achieved by absorption in the layer 16 supporting the thermocouple junction 22, rather than transmission through a discrete optical filter, imaging quality and spectral purity are enhanced.

While the invention has been particularly shown and described with respect to preferred embodiments thereof, including various materials, dimensions and wavelengths, it will be understood by those skilled in the art that changes in form and details may be made therein without departing from the scope and spirit of the invention.

What is claimed is:

1. A radiation detector, comprising:
   a substrate surrounding a cavity;
   a filter layer overlying at least a portion of a surface of said substrate and spanning the cavity, said filter layer having a first surface facing the cavity and a second surface opposite the first surface; and
   at least one thermally responsive junction between dissimilar materials that is disposed upon and supported by said second surface of said filter layer over the cavity; wherein
   said filter layer is comprised of alternating films of a first material and a second material selected for absorbing incident electromagnetic radiation within a predetermined band of wavelengths and for reflecting incident electromagnetic radiation outside of the predetermined band of wavelengths.

2. A radiation detector as set forth in claim 1 wherein said filter layer has a thickness of less than one micrometer.

3. A radiation detector as set forth in claim 1 wherein said dissimilar materials include bismuth and antimony.

4. A radiation detector as set forth in claim 1 wherein said first material is comprised of zinc selenide, and wherein said second material is comprised of magnesium fluoride.

5. A radiation detector as set forth in claim 1 wherein said first material is comprised of germanium, and wherein said second material is comprised of magnesium fluoride.

6. An array of radiation detectors at least two of which are responsive to electromagnetic radiation within different spectral bands, comprising:
   a substrate having a plurality of cavities;
   for each of said cavities, a filter layer overlying at least a portion of a surface of said substrate and spanning the cavity, said filter layer having a first surface facing the cavity and a second surface opposite the first surface; and
   at least one thermally responsive junction between dissimilar materials that is disposed upon and supported by said second surface of said filter layer over the cavity; wherein
   a filter layer spanning a first cavity is comprised of a filter stack having an optical characteristic selected for absorbing incident electromagnetic radiation within a first predetermined band of wavelengths; and
   a filter layer spanning a second cavity is comprised of a filter stack having an optical characteristic selected for absorbing incident electromagnetic radiation within a second predetermined band of wavelengths.

7. An array of radiation detectors as set forth in claim 6 wherein each of said filter stacks has a thickness of less than one micrometer.

8. An array of radiation detectors as set forth in claim 6 wherein said dissimilar materials include bismuth and antimony.

9. An array of radiation detectors as set forth in claim 6 wherein at least one of said first and second filter stacks is comprised of alternating layers comprised of zinc selenide and magnesium fluoride.

10. An array of radiation detectors as set forth in claim 6 wherein at least one of said first and second filter stacks is comprised of alternating layers comprised of germanium and magnesium fluoride.

11. A method for fabricating a radiation detector, comprising the steps of:
    providing a substrate having an opening;
    fabricating a filter structure comprised of alternating films of a first material and a second material selected for absorbing incident electromagnetic radiation within a predetermined band of wavelengths;
    placing the filter structure upon the substrate such that it overlies at least a portion of a surface of the substrate and spans the opening, the filter structure being placed to have a first surface facing the opening and a second surface opposite the first surface; and
    forming at least one thermally responsive junction between dissimilar materials upon the second surface of the filter structure over the opening.

12. A method as set forth in claim 11 wherein the filter structure has a thickness of less than one micrometer.

13. A method as set forth in claim 11 wherein the dissimilar materials include bismuth and antimony.

14. A method as set forth in claim 11 wherein the first material is comprised of zinc selenide, and wherein the second material is comprised of magnesium fluoride.

15. A method as set forth in claim 11 wherein the first material is comprised of germanium, and wherein the second material is comprised of magnesium fluoride.

16. A method as set forth in claim 11 wherein the step of providing a substrate provides a substrate with a plurality of openings, wherein the step of fabricating fabricates a plurality of filter structures at least two of which absorb incident electromagnetic radiation within different predetermined bands of wavelengths, wherein the step of placing places individual ones of the plurality of filter structures to span individual ones of the plurality of openings, and wherein the step of forming forms at least one thermally responsive junction between dissimilar materials upon the second surface of each of the plurality of filter structures.

17. A method as set forth in claim 11 wherein the step of fabricating includes the steps of:

providing a layer of backing material;

forming the filter structure upon a surface of the backing material such that the first surface of the filter structure is adjacent to the surface of the backing material; and removing a portion of the backing material to expose the first surface of the filter structure.

18. A method as set forth in claim 17 wherein the step of forming the filter structure includes a step of evaporating alternating film layers of the first and second materials.

\* \* \* \* \*